United States Patent [19]

Gunsagar et al.

[11] 4,035,821
[45] July 12, 1977

[54] DEVICE FOR INTRODUCING CHARGE

[75] Inventors: Kamleshwar C. Gunsagar, Campbell; Gilbert F. Amelio, Saratoga, both of Calif.

[73] Assignee: Fairchild Camera and Instrument Corporation, Mountain View, Calif.

[21] Appl. No.: 653,677

[22] Filed: Jan. 29, 1976

Related U.S. Application Data

[63] Continuation of Ser. No. 492,650, July 29, 1974, abandoned.

[51] Int. Cl.² .......................................... H01L 29/78
[52] U.S. Cl. .................................................. 357/24
[58] Field of Search ..................................... 357/24

[56] References Cited

U.S. PATENT DOCUMENTS

| | | | |
|---|---|---|---|
| 3,760,202 | 9/1973 | Kosonocky | 357/24 |
| 3,866,067 | 2/1973 | Amelio | 357/24 |

OTHER PUBLICATIONS

RCA – Tech. Notes No. 931, Apr. 1973 – Kosonocky.
RCA–Review – vol. 34 – Dec. 1973 – Carnes et al.

*Primary Examiner*—Edward J. Wojciechowicz
*Attorney, Agent, or Firm*—Alan H. MacPherson; Henry K. Woodward; Norman E. Reitz

[57] ABSTRACT

A device for introducing a known amount of charge to a line of charge storage elements in a charge-coupled device fabricated in a conductor-insulator-semiconductor system includes a buffer charge storage element fabricated adjacent a first charge storage element in the line of charge storage elements, the buffer charge storage element having its gate electrode controlled by a logic pulse whose level determines whether charge is to be introduced to the line of charge storage elements, and precharge means coupled to this buffer charge storage element for supplying a saturating charge to the buffer charge storage element.

12 Claims, 29 Drawing Figures

DEVICE FOR INTRODUCING CHARGE

This is a continuation of application Ser. No. 492,650, filed July 29, 1974, and now abandoned.

BACKGROUND OF THE INVENTION

This invention relates to a device for introducing charge and, more particularly, relates to a device for introducing a known amount of charge to a conductor-insulator-semiconductor charge storage element in a charge-coupled device.

Charge-coupled devices provide new ways to accomplish objectives that previously were accomplished by electromechanical and electronic devices. The concepts and applications are set forth in the article, "Charge-Coupled Devices" by Gilbert G. Amelio, *Scientific American*, vol. 230, No. 2, Feb. 1974. The practicability of these devices was previously established in an article entitled "Experimental Verification of the Charge Coupled Device concept" by Amelio et al, *Bell System Technical Journal*, Apr. 19, 1970, p. 593.

A necessary feature of any practical digital charge-coupled device is that a known amount of input charge must be written into the first charge storage element. Typically, the introduction of a known amount of charge is used to signify a digital 1 while the absence of charge is used to signify a digital 0 but the inverse convention or any suitable convention may be employed. Existing input writing schemes have required either pulsing a source diffusion, pulsing a control electrode, or performing a combination of these steps. Pulsing a source diffusion requires that the potential of the diffusion region be varied between a high level, $V_1$, and a low level, $V_2$. The two levels are specified so that the low potential will spill over a gate electrode and precisely fill the first charge storage element when its clock pulse is at a high potential (in a p-substrate system, charge packets of electrons are transferred). This pulsing scheme requires the pulse level to by precisely controlled and does not readily permit a small amount of charge, sometimes called a "fat zero," to be introduced unless precise and complex pulse timing is employed. If a control electrode is pulsed at the beginning of a line of charge storage elements in a charge-coupled device (CCD line), charge can be stored beneath the control electrode whenever it goes high enough to create a potential well which will receive charge from an adjacent source region. Thus, the logic which drives the control electrode determines whether or not charge is temporarily stored beneath the control electrode. As the potential on the first charge storage element CCD line goes high enough to accept the charge beneath the control electrode, a charge is effectively written into CCD line. In a digital system, the control electrode will have two possible potentials. One potential is lower than that in the source region; the other potential is higher than that in the source region. Thus, a small charge, i.e., a fat zero, cannot be written into the CCD line unless very precise timing of the pulsing of the control electrode is achieved. Also, charge may not be written selectively into addressed lines in a random-access memory incorporating a one-and-one-half phase CCD system (a system with a series of dynamic electrodes in regular alternation with a series of static electrodes) since the clocking pulse on the dynamic electrodes is high in the unaddressed lines of most preferred embodiments and charge cannot readily be kept out of these unaddressed lines.

SUMMARY OF THE INVENTION

The present invention introduces a known amount of charge without requiring that any critical parameters be achieved. The present invention comprises a device for introducing a known amount of charge to a line of charge storage elements in a charge-coupled device fabricated in a conductor-insulator-semiconductor system and includes a buffer charge storage element fabricated adjacent a first storage element in the line of charge storage elements, the buffer charge storage element having its gate electrode controlled by a logic pulse whose level determines whether charge is to be introduced to the line of charge storage elements, and precharge means coupled to said buffer charge storage element for supplying a saturating charge to the buffer charge storage element.

BRIEF DESCRIPTION OF THE DRAWINGS

For a more complete understanding of the device of the present invention for introducing a known amount of charge to a charge-coupled device, reference may be had to the drawings which are incorporated herein and in which:

FIGS. 6A-14 6D are pictorial illustrations of the potential wells existing in the substrate of the device of FIG. 5 at successive points in time, the potential wells being shown in registration with the cross-section of FIG. 5;

FIG. 7 is a cross-sectional view of another embodiment of the device of the present invention for introducing a known amount of charge to an addressed line in a random-access memory incorporating a one-and-one-half-phase CCD system;

FIG. 9 is a cross-sectional view of an embodiment of the device of the present invention for introducing a known amount of charge or alternately a fat zero to an addressed line in a random-access memory incorporating a one-and-one-half-phase CCD system.

DESCRIPTION OF THE PREFERRED EMBODIMENTS

In a practical charge-coupled device the introduction of a known amount of charge must be accomplished in a simple and reliable manner. This result is accomplished by the device of the present invention which utilizes a precharge mechanism to fill a buffer charge storage element. The buffer charge storage element is filled to overflowing and then excess charge is drained away, in a manner analagous to dipping a ladle into a bucket of water and removing it. This mechanism makes the capacity of the buffer charge storage element the only variable in determining the amount of charge which is introduced to the CCD line so that a known amount of charge can be introduced, without the necessity of generating a precise source potential or of activating a control electrode for a precise period of time.

Figure 1:
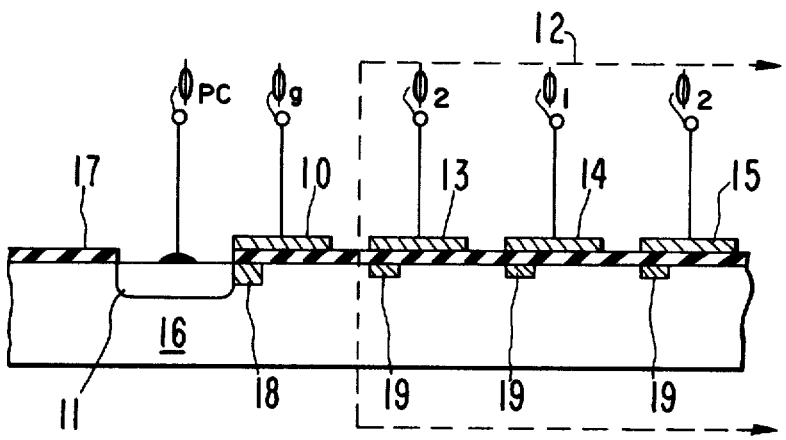
FIG. 1 is a cross-sectional view of an embodiment of the device of the present invention for introducing a known amount of charge to a two-phase CCD line.

The present invention permits the introduction of a known amount of charge to a conductor-insulator-semiconductor charge storage element in a charge-coupled device without carrying out a controlled pulsing of a source diffusion or of an electrode. This is accomplished, as shown in FIG. 1, by providing a gate electrode 10 which is placed between a diffused source region 11 and a line of charge storage elements indicated by the dotted line 12. Each charge storage element comprises an electrode, e.g., electrode 13, and the portion of insulator 17 and substrate 16 underlying the electrode. The electrodes may be formed of metal or other conductive material such as appropriately doped polycrystalline silicon. The insulator may be silicon dioxide, $SiO_2$, silicon nitride, $Si_3N_4$, or other suitable insulating material. The substrate is doped monocrystalline silicon or other suitable semiconductor material. If substrate 16 is of p-type conductivity, the diffused source region 11 will be n-type and the minority carriers which make up the charge packets transferred along the charge storage elements will be electrons.

Figure 2A:
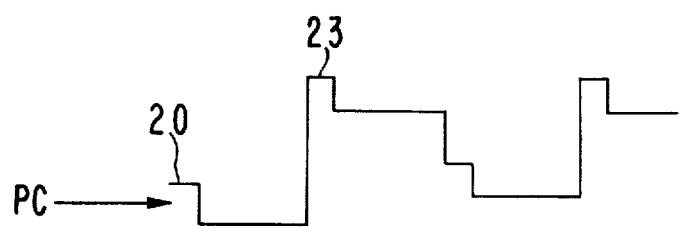
FIGS. 2A–2F are pictorial illustrations of the potential wells existing in the substrate of the device of FIG. 1 at successive points in time, the potential wells being shown in registration with the cross-section of FIG. 1.
Figure 2B:
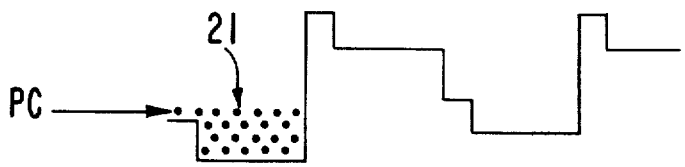

The buffer charge storage element of FIG. 1 is comprised of gate electrode 10 and the portion of insulation material 17 and substrate 16 which underlies gate electrode 10. Gate electrode 10 is controlled by a logic pulse $0_g$. A potential well is formed in the portion of substrate 16 underlying gate electrode 10 and serves to temporarily store charge and transmit it to the line 12 of charge storage elements in accordance with the level of logic pulse $0_g$. The basic operation of the device of the present invention is shown in FIGS. 2A–2F which are pictorial illustrations of the potential profile existing in substrate 16 at successive points in time. The potential profiles are shown in registration with their location in substrate 16. Initially, the potential on gate electrode 10 will be high, the clocking pulse $0_2$ on the series of electrodes 13, 15, . . . will be low and the clocking pulse $0_1$ on electrodes 14, . . . will be high. Initially, also, the precharge potential established by precharge pulse $0_{pc}$ in the diffused region 11 will be high as indicated in FIG. 2A. The well of the buffer charge storage element is filled when the level of diffused source region 11 is lowered beneath the level of the potential barrier 20 formed by impurity implant 18 in substrate 16 on the left side of gate electrode 10. For a substrate with a p-type conductivity concentration of $10^{15}/cm^3$, an impurity implant of boron with a surface concentration of $10^{12}/cm^3$ will produce a suitable potential barrier 20.

Figure 2C:
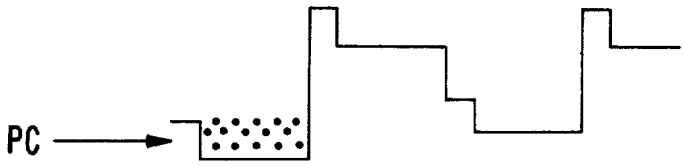
Figure 2D:
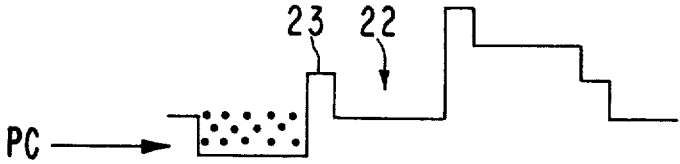
Figure 2E:
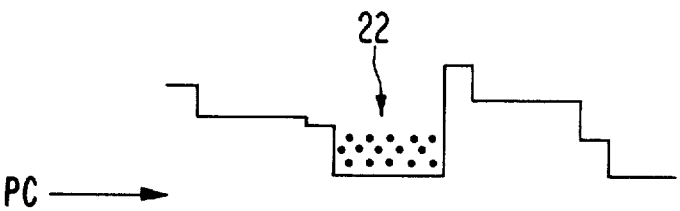
Figure 2F:
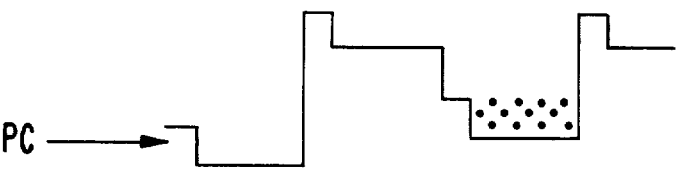

The potential level to which the diffused source region moves is not critical so long as it is below the level of potential barrier 20 but not below potential barrier 23. Then as shown in FIG. 2C the diffused source region goes high so that any excess charge is drained off and the potential well 21 of the buffer charge storage element is left full. If a 0 is to be introduced to the CCD line, i.e., if no charge is to be sent down the CCD line, the level of logic pulse $0_g$ on gate electrode 10 will remain constant and the full charge will remain in potential well 21, as shown in FIG. 2D, while the clocking pulse $0_2$ goes high to create adjacent potential well 22. If, however, a digital 1 is to be introduced to the CCD line, logic pulse $0_g$ goes low. As shown in FIG. 2E the charge in potential well 21 pours over the potential barrier 23 formed by impurity implant 19 underneath the left side of electrode 13 and fills potential well 22 underneath electrode 13. The sense of the logic pulse $0_g$ on gate electrode 10 thereby controls the introduction of charge into the CCD line 12. Once in CCD line 12, the charge is transmitted in the forward direction, as shown in FIG. 2F, the forward direction being defined as is well known in the CCD art by the location of implants 19.

Figure 3:
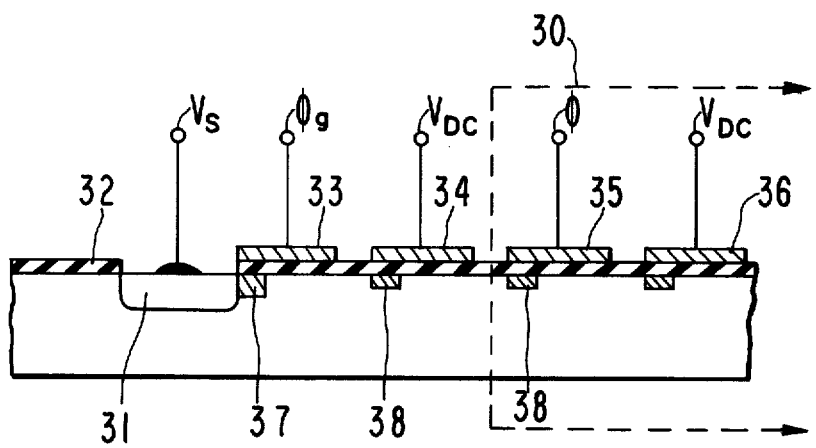
FIG. 3 is a cross-sectional view of an embodiment of the device of the present invention for introducing a known amount of charge to a one-and-one-half phase CCD line.
Figure 4A:
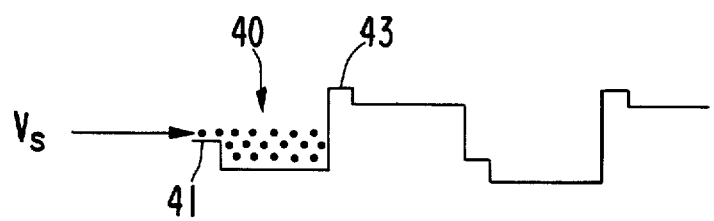
FIGS. 4A–4E are pictorial illustrations of the potential wells existing in the substrate of the device of FIG. 3 at successive points in time, the potential wells being shown in registration with the cross-section of FIG. 3.
Figure 4B:
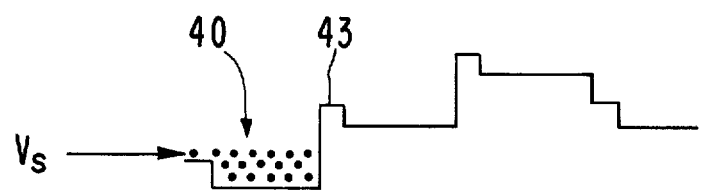
Figure 4C:
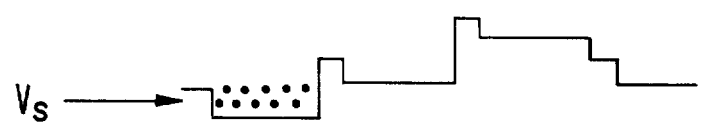
Figure 4D:
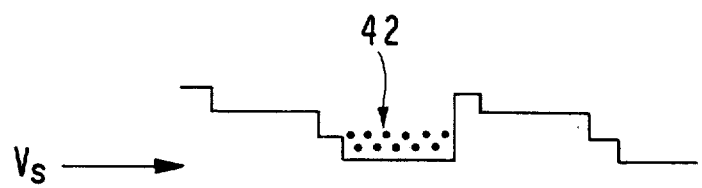
Figure 4E:
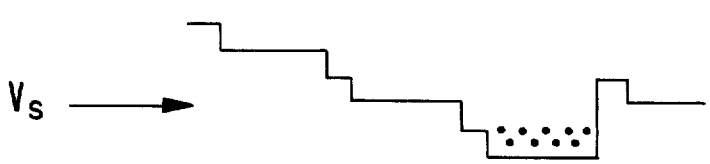

The device of the present invention can be simplified for introducing charge to a one-and-one-half-phase CCD line. As is known in the CCD art, a one-and-one-half-phase line constitutes a series of dynamic electrodes positioned in alternation with a series of electrodes with constant potential. As shown in FIG. 3, a gate electrode 33 is placed between diffused source region 31 and a dedicated static electrode 34. The potential on diffused source region 31 is kept constant at $V_S$ which is slightly below the level of potential barrier 41 created by impurity implant 37 underneath gate electrode 33 when logic pulse $0_g$ is high. The constant level may be used rather than a pulsed level because the level of potential barrier 43 created by implant 38 underneath dedicated static electrode 34 is sufficiently low so there is no possibility of charge spilling over from the potential well 40 when $0_g$ goes low until after the level of potential barrier 41 goes below the level of $V_S$, as shown in FIG. 4C. Thus, only a known amount of charge, i.e., a full charge packet, will ever be transferred from the potential well 40 of the buffer charge storage element to potential well 42, as shown in FIG. 4D. Thus, no detriment is incurred by originally overfilling potential well 40 by placing the potential on diffused source region 31 slightly below that of barrier 41. Again, the exact positioning of the level $V_S$ is not critical as long as it is below the level of barrier 41 and above the level of barrier 43. From potential well 42 the charge will proceed along the CCD line 30 in accordance with the clocking of the dynamic electrodes 35, . . . as shown in FIG. 4E.

The charge-introduction device of the present invention is especially useful for application to random-access memories which incorporate charge-coupled shift registers. In these types of memories, the input diffusion and/or control gate potential are common to at least several lines. Since the memory organization may require, for example, the clocking pulse of dynamic electrodes in a one-and-one-half-phase system be maintained at a high potential for a particular line which is not addressed, it is necessary to avoid introducing charge to a line just because its dynamic electrodes are high. Charge must be selectively introduced only to those lines which are addressed, i.e., in which dynamic electrodes are allowed to go low. This is accomplished in the embodiments shown in FIGS. 5 and 9 and in the preferred embodiment of FIG. 7. Each embodiment only permits charge to be introduced when the dedicated dynamic electrode goes low, i.e., only when a particular line is addressed.

Figure 5:
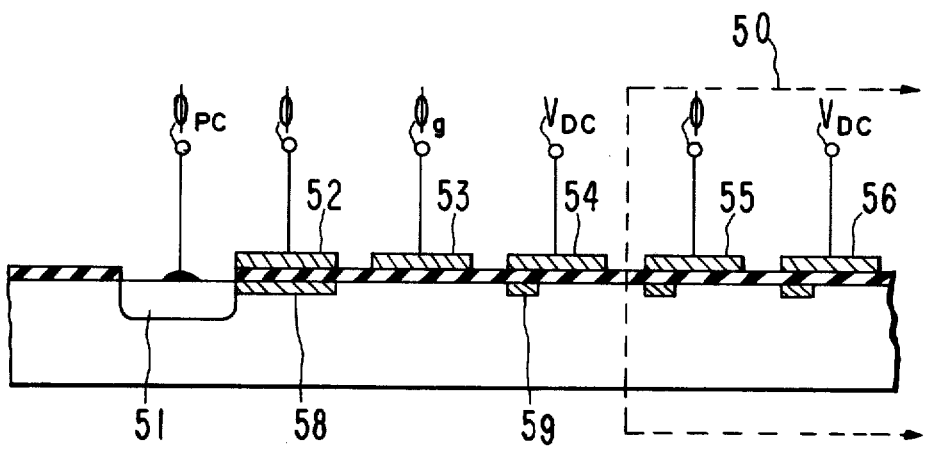
FIG. 5 is a cross-sectional view of an embodiment of the device of the present invention for introducing a known amount of charge to an addressed line in a random-access memory incorporating a one-and-one-half-phase CCD system.
Figure 6A:
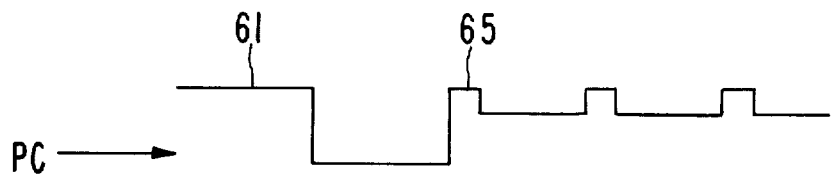
Figure 6B:
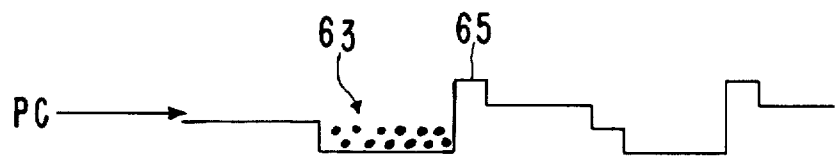
Figure 6C:
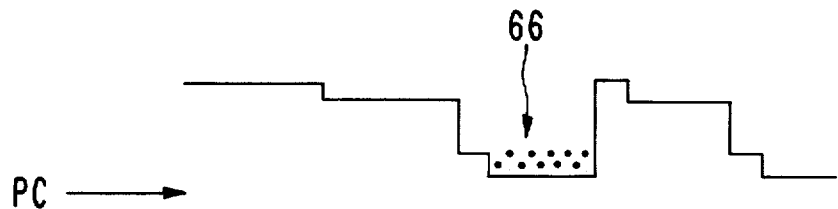
Figure 6D:
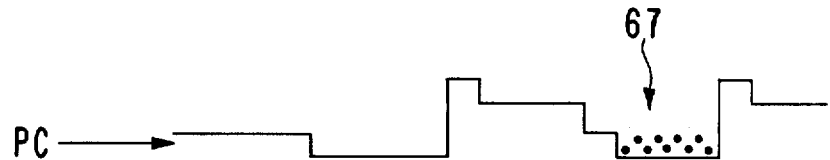

In FIG. 5 a dedicated dynamic electrode 52 is inserted between the diffused source region 51 and the gate electrode 53 of the buffer charge storage element and a dedicated static electrode 54 is inserted between gate electrode 53 of the buffer charge storage element and the first electrode 55 in the CCD ine 50. The operation of the device of FIG. 5 is shown in FIGS. 6A–6D. A potential profile is shown in FIG. 6A in which the potential level for 0 is equal to $V_{DC}$. The equal height of potential barriers 61 and 65 results from the fact that impurity implants 58 and 59 underneath the dedicated dynamic electrode 52 and dedicated static electrode 54, respectively, are of the same concentration. Normally, as stated above, clocking pulse 0 will be high in an unaddressed line in a random-access memory. As shown in FIG. 6B a slight lowering of the potential on the diffused source region 51 will allow charge to flow over potential barrier 61 and into potential well 63 of the buffer charge storage element. The precise level of the precharge source region is not critical so long as it goes below the level of potential barrier 61 but does not go below the level of potential barrier 65. If the line is addressed and if charge is to be written, both clocking pulses 0 and $0_g$ go low and charge flows over potential barrier 65 and into potential well 6 underneath dedicated static electrode 54. Then when 0 goes high again, the charge passes into potential well 67 underneath electrode 55. If the line is addressed but no charge is to be written 0 goes low and $0_g$ stays high to leave the charge in potential well 63.

Figure 7:
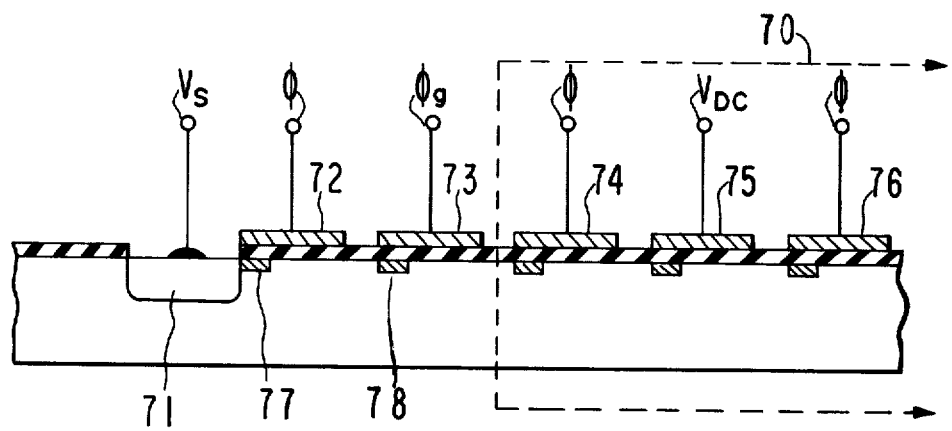
Figure 8A:
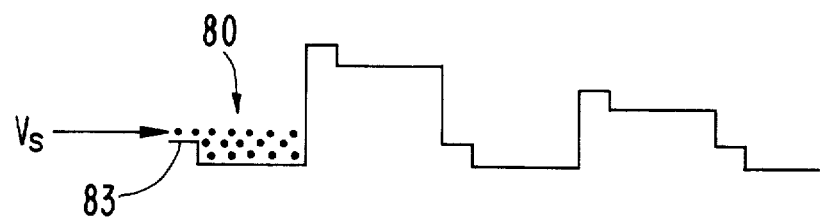
FIGS. 8A–8D are pictorial illustrations of the potential wells existing in the substrate of the device of FIG. 5 at successive points in time, the potential wells being shown in registration with the cross-section of FIG. 7.
Figure 8B:
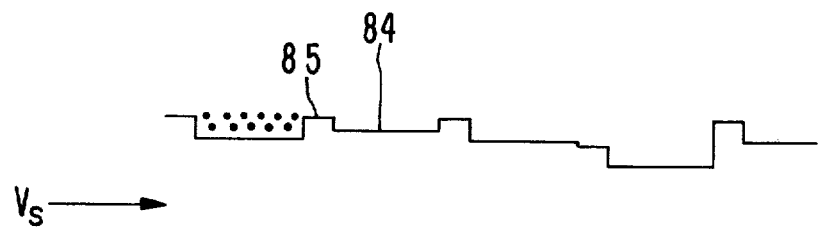
Figure 8C:
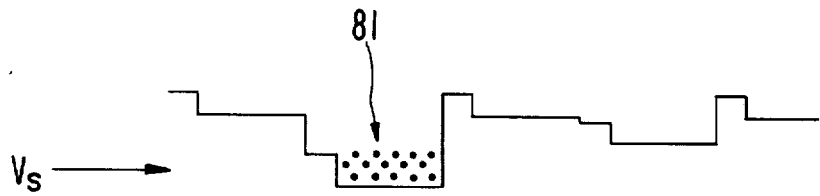
Figure 8D:
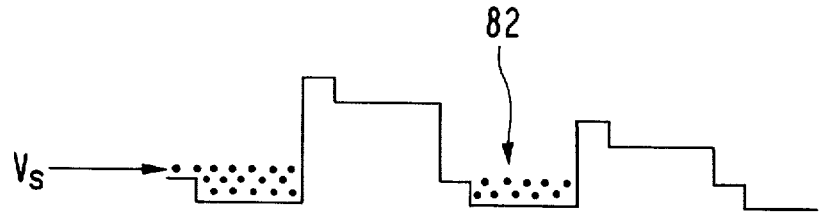

A preferred embodiment of the device of the present invention which permits charge to be introduced to an addressed line in a random-access memory is shown in FIG. 7. In FIG. 7, diffused source region 71 is maintained at a constant potential $V_S$. An electrode 72 of a dedicated dynamic charge storage element is fabricated between diffused source region 71 and gate electrode 73 of the buffer charge storage element which is adjacent the CCD line 70. CCD line 70 consists of dynamic electrodes 74, 76 . . . and static electrodes 75, . . . while the electrode 72 and the series of dynamic electrodes 74, 76, . . . are at a high potential, the level of potential barrier 83 formed by impurity implant 77 underneath dedicated dynamic electrode 72 is at a slightly higher potential than the level $V_S$ of the diffused source region as shown in FIG. 8A. Potential well 80 is thus filled to overflowing. At this point the logic pulse on gate electrode 73 of the buffer charge storage element is low. Then, when clocking pulse 0 goes low, e.g., when the particular line is addressed, the potential barrier formed underneath electrode 72 by implant 77 is raised above the level $V_S$ of the diffused source region to drain off any excess charge from potential well 80. At this point, however as shown in FIG. 8B, no charge will have spilled over onto potential level 84 because potential barrier 85 formed by implant 78 is sufficiently high to prevent spillover. If a charge, e.g., a logical 1 is to be written into the memory, then the logic pulse $0_g$ on gate electrode 73 of the buffer charge storage element goes high, as shown in FIG. 8C, so that the potential well 81 of the buffer charge storage element formed underneath gate electrode 73 accepts the charge previously stored in potential well 80. Charge is actually written into the first potential well 82 in the CCD line 70 when logic pulse $0_g$ again goes low and dynamic pulse 0 goes high and the contents of potential well 81 are spilled over into potential well 82. It is clear that the presence of dedicated dynamic electrode 72 prevents unaddressed lines, i.e., lines in which dynamic pulse 0 remains high, from receiving charge.

Figure 9:
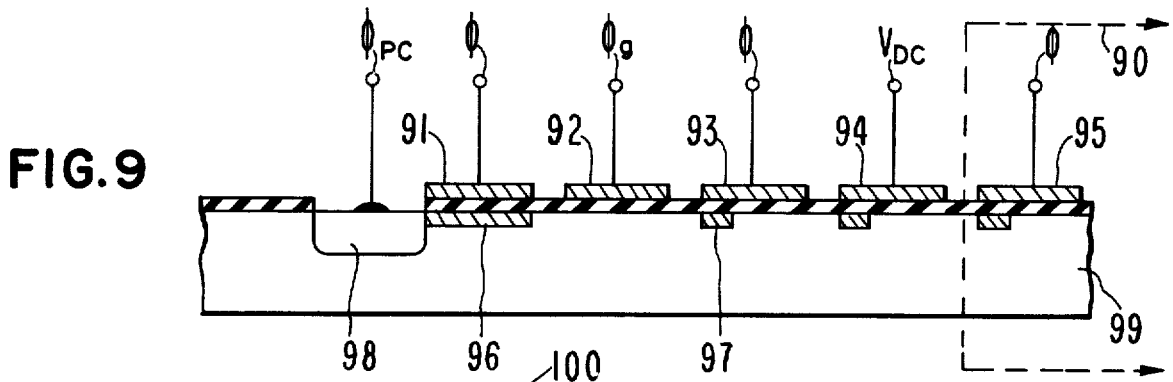
Figure 10A:
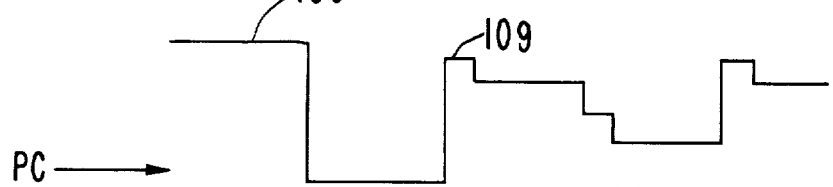
FIGS. 10A–10E are pictorial illustrations of the potential wells existing in the substrate of the device of FIG. 9 at successive points in time, the potential wells being shown in registration with the cross-section of FIG. 9.
Figure 10B:
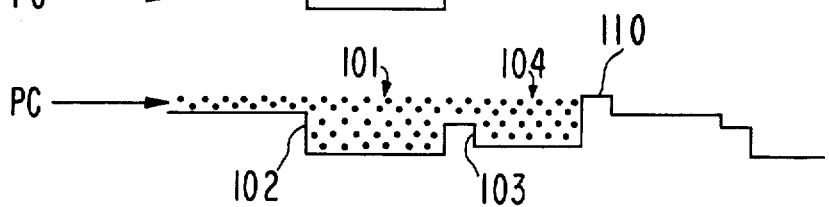
Figure 10C:
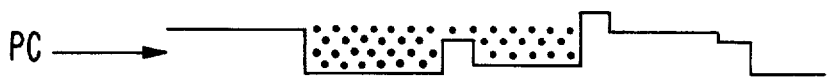
Figure 10D:
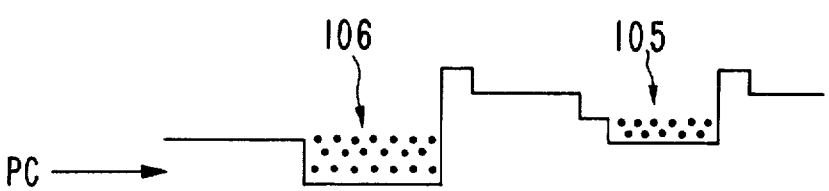
Figure 10E:
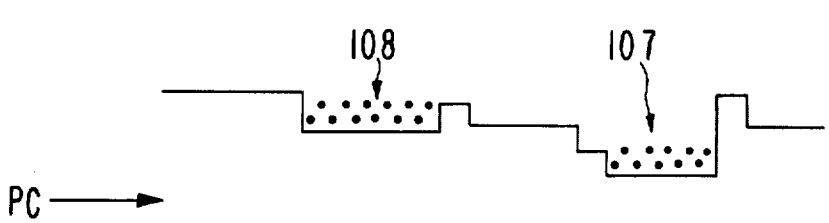

The embodiment of FIG. 9 is a variation of the embodiment of FIG. 5 which permits either a full charge or a nominal charge to be introduced to an addressed line in a random-access memory. A dedicated dynamic electrode 91 of a dedicated dynamic charge storage element is placed between diffused source region 98 and gate electrode 92 of the buffer charge storage element. A dynamic electrode 93 of a second dedicated dynamic charge storage element and a static electrode 94 of a dedicated static charge storage element are placed between gate electrode 92 and the CCD line 90. From the relative levels of potential barriers 100 and 109 in the potential profile of FIG. 10A it can be seen that impurity implant 96 underneath dedicated dynamic electrode 91 is of slightly greater concentration than implant impurity 97 beneath second dynamic electrode 93. This allows a common pool of charge to be held in potential wells 101 and 104 and over barrier potential 109 as shown in FIGS. 10B and 10C. In a random-access memory in which 0 is normally high, potential wells 101 and 104 underneath gate electrode 92 and second dynamic electrode 93, respectively, will be filled to overflowing if the level of precharge diffusion 98 is lowered slightly as shown in FIG. 10B. The precise level of the precharge diffusion is not critical so long as it is below potential barrier 100 but not below the level of potential barrier 110 formed underneath dedicated static electrode 94. When the level of the precharge source region is then raised above the level of potential barrier 100, the potential wells are left as shown in FIG. 10C. Now, if no signal is to be transmitted, i.e., if only a nominal charge such as a fat zero is to be introduced, a portion of the contents of potential well 104 will spill over into potential well 105 underneath dedicated static electrode 94 when 0 goes low as shown in FIG. 10D. The amount of charge will be determined by the geometry of second dynamic electrode 93 and the height 103 of the potential barrier formed underneath second dynamic electrode 93. Any excess charge above height 103 spills back into the precharge diffusion before charge spills over into potential well 105 while the charge below height 103 will spill over into potential well 105. If a full charge packet or some significant fraction of a full charge is to be introduced, the logic pulse $0_g$ will go shortly after clocking pulse 0 goes low. Thus, in addition to the nominal charge previously transferred, any charge in potential well 101 between the height of potential barrier 103 and the height of potential barrier 102 will be transferred, as shown in FIG. 10E. Any charge contained in potential well 101 up to the level of potential barrier 103 remains behind. It is a matter of geometric design to establish appropriate potential barrier heights and charge storage capacities for the potential wells.

The charge-introduction devices of the present invention which have been described heretofore in the specification have utilized p-type substrates in which electrons have served as minority carriers. Devices composed of an n-type substrate would operate in a similar manner with holes as minority carriers. The potential on the dedicated electrodes and the dynamic and static CCD electrodes would be reversed in such a system. Throughout this specification the potentials of the electrodes and of the potential wells have been described by the relative terms "higher" and "lower". This nomenclature is valid only for a conductor-insulator-semiconductor system with a p-substrate in which a high potential impressed on the gate produces a larger depletion region or potential well. Thus, a high potential level signifies a high electrode voltage and a deep potential well, while a low potential level signifies a low electrode voltage and a shallow potential well.

What is claimed is:

1. In a charge-coupled semiconductor storage array including a semiconductor substrate of one conductivity type with a line of charge storage elements for receiving and transferring electrical charge, each element including an electrode on a major surface of said substrate and spaced therefrom by an insulating layer, a device for introducing a predetermined amount of charge to said line of charge storage elements comprising:
   a buffer charge storage element fabricated adjacent a first charge storage element and including
      a gate electrode on said major surface and spaced therefrom by an insulating layer and controlled by a logic pulse, the level of said pulse determining whether charge is to be introduced to said line of charge storage elements, and
      a barrier region of said one conductivity type in said substrate with a net dopant concentration greater than said substrate, said barrier region being disposed beneath a portion of said gate electrode of said buffer charge storage element and adjacent to precharge means whereby said barrier region provides a potential barrier which determines the amount of saturating charge which may flow from precharge means and be retained by said buffer charge storage means; and
   precharge means including a region of said opposite conductivity type in said substrate adjacent said buffer charge storage element for supplying a saturating charge to said buffer charge storage element.

2. A device in accordance with claim 1 wherein said semiconductor is a substrate of n-type conductivity.

3. A device in accordance with claim 1 wherein said semiconductor is a substrate of p-type conductivity.

4. A device in accordance with claim 3 wherein said precharge means comprise a first region of n-type conductivity formed in the surface of p-type substrate and adjacent said buffer charge storage element.

5. A device in accordance with claim 4 wherein said barrier region includes an p-type impurity implanted in a portion of said p-type substrate underneath said gate electrode of said buffer charge storage element on the side adjacent said precharge means.

6. A device in accordance with claim 5 wherein said first region of n-type conductivity is maintained at a constant potential and further comprising:
   a dedicated static charge storage element fabricated between said buffer charge storage element and said first charge storage element in said line of charge storage elements, said dedicated static charge storage element including an p-type impurity implanted in a portion of said p-type substrate underneath the gate electrode of said dedicated static charge storage element on the side adjacent said buffer charge storage element.

7. A device in accordance with claim 6 wherein said constant potential is selected so that charge is introduced to said buffer charge storage element when the level said logic pulse is high.

8. A device in accordance with claim 4 further comprising:
   a dedicated dynamic charge storage element fabricated between said region of n-type conductivity and said buffer charge storage element, said dedicated dynamic charge storage element having an p-type impurity implanted in said p-type substrate underneath the gate electrode of said dedicated dynamic charge storage element; and
   a dedicated static charge storage element fabricated between said buffer charge storage element and said first charge storage element in said line of charge storage elements, said dedicated static charge storage element having an p-type impurity implanted in a portion of said p-type substrate underneath the gate electrode of said dedicated static charge storage element on the side of said buffer charge storage element.

9. A device in accordance with claim 8 further comprising:
   a second dedicated dynamic charge storage element fabricated between said buffer charge storage element and said dedicated static charge storage element, said second dedicated dynamic charge storage element having an p-type impurity implanted in a portion of said p-type substrate underneath the gate electrode of said second dedicated dynamic charge storage element on the side of said buffer charge storage element, the concentration of said p-type impurity implanted underneath said gate electrode of said dedicated dynamic charge storage element being greater than the concentration of said p-type impurity implanted underneath said gate electrode of said second dedicated dynamic charge storage element.

10. A device in accordance with claim 4 further comprising:
    a dedicated dynamic charge storage element fabricated between said region of n-type conductivity and said buffer charge storage element, said dedicated dynamic charge storage element having an p-type impurity implanted in a portion of said p-type substrate underneath the gate electrode of said dedicated dynamic charge storage element on the side adjacent said region of n-type conductivity.

11. A device in accordance with claim 10 wherein said buffer charge storage element includes an p-type impurity implanted in a portion of said p-type substrate underneath said gate electrode of said buffer chargestorage element on the side adjacent said dedicated dynamic charge storage element.

12. A device in accordance with claim 11 wherein said region of p-type conductivity is maintained at a constant potential.

* * * * *